United States Patent [19]
Kono et al.

[11] Patent Number: 6,083,657
[45] Date of Patent: Jul. 4, 2000

[54] POSITIVE PHOTORESIST COMPOSITIONS AND A PROCESS FOR PRODUCING THE SAME

[75] Inventors: Shinichi Kono; Yasuo Masuda; Atsushi Sawano; Hayato Ohno; Hidekatsu Kohara; Toshimasa Nakayama, all of Kanagawa-ken, Japan

[73] Assignee: Tokyo Ohka Kogyo Co., Ltd., Kawasaki, Japan

[21] Appl. No.: 09/231,826

[22] Filed: Jan. 15, 1999

[30] Foreign Application Priority Data

Jan. 23, 1998 [JP] Japan .................................. 10-026724

[51] Int. Cl.[7] .................. G03F 7/023; G03F 7/30
[52] U.S. Cl. .................. 430/191; 430/165; 430/192; 430/193; 430/326; 528/157
[58] Field of Search ..................... 430/192, 193, 430/165, 191, 326; 528/157

[56] References Cited

U.S. PATENT DOCUMENTS

| | | | |
|---|---|---|---|
| 5,019,479 | 5/1991 | Oka et al. | 430/192 |
| 5,087,548 | 2/1992 | Hosaka et al. | 430/192 |
| 5,188,920 | 2/1993 | Moriuma et al. | 430/191 |
| 5,372,909 | 12/1994 | Nishi et al. | 430/192 |
| 5,429,904 | 7/1995 | Nagase et al. | 430/192 |
| 5,447,825 | 9/1995 | Nishi et al. | 430/326 |
| 5,451,484 | 9/1995 | Nagase et al. | 430/192 |
| 5,478,692 | 12/1995 | Doi et al. | 430/191 |
| 5,500,193 | 3/1996 | Hosoda et al. | 430/191 |
| 5,534,382 | 7/1996 | Kawabe et al. | 430/192 |
| 5,652,081 | 7/1997 | Tan et al. | 430/192 |
| 5,843,616 | 12/1998 | Edamastu et al. | 430/192 |

*Primary Examiner*—John S. Chu
*Attorney, Agent, or Firm*—Wenderoth, Lind & Ponack, L.L.P.

[57] ABSTRACT

Phenolic compound (a) is polycondensed with mixed aldehyde (b) consisting essentially of 5–30 mol % of unsaturated aliphatic aldehyde (b-1) and 70–95 mol % of saturated aliphatic aldehyde (b-2) to give alkali-soluble novolak resin (A) as the product of polycondensation reaction. The alkali-soluble novolak resin (A) is used with quinonediazido group containing compound (B) to produce a positive photoresist composition. According to the present invention, there are specifically provided a positive photoresist composition that has high feature integrity in spite of high sensitivity and which yet provides a great depth of focus, a process for producing such positive photoresist composition, as well as an alkali-soluble novolak resin that can advantageously be used in such composition, and a method of forming patterns with high reproducibility using such positive photoresist composition.

19 Claims, No Drawings

POSITIVE PHOTORESIST COMPOSITIONS AND A PROCESS FOR PRODUCING THE SAME

BACKGROUND OF THE INVENTION

1. Field of the Invention

This invention relates to positive photoresist compositions and a process for producing the same, as well as alkali-soluble novolak resins that can advantageously be used in such compositions. More particularly, the invention relates to positive photoresist compositions that have high feature integrity in spite of high sensitivity and which yet provide a great depth of focus. The invention also relates to a process for producing such positive photoresist compositions and alkali-soluble novolak resins that can advantageously be used in such compositions. The invention further relates to a method of forming patterns with high reproducibility using the stated compositions.

2. Description of Related Art

In the process of fabricating semiconductor devices such as ICs and LSIs and liquid-crystal devices such as LCDs, positive photoresist compositions comprising the combination of film-forming alkali-soluble resins and a photosensitive component made of quinonediazido group containing compounds are used commercially on account of their high resolution, sensitivity and resistance to etching.

With the ever increasing degree of integration in semiconductor devices and liquid-crystal devices, a demand has arisen in VLSI production to process superfine patterns in as high precision as to realize feature sizes in a submicron range or not more than half a micron meter. Under the circumstances, the positive photoresist composition to be used must satisfy various requirements in characteristics such as the highest possible feature integrity without impairing high sensitivity, and a great enough depth of focus to reproduce resist patterns faithful to a mask pattern without being affected by undesired phenomena such as standing waves and random reflection from a substrate having steps on the surface.

The previous attempts at improving these characteristics have largely been directed to phenols in alkali-soluble resins, the photosensitive component made of quinonediazido group containing compounds and a sensitizer component made of poly-phenolic compounds.

The relationship between sensitivity and feature integrity is generally one of trade-off and an attempt at increasing sensitivity results in a lower feature integrity due to pronounced narrowing of the unexposed areas and vice versa.

Take, for example, the case of improvement of phenols, in which the major problem has been with the relative proportions of different kinds of phenols. A photoresist containing a resin that has a large proportion of m-cresol having comparatively high reactivity features high sensitivity but is poor in resolution due to a small depth of focus. If the proportion of p-cresol which is less reactive than m-cresol is increased, the depth of focus increases to provide better resolution but, on the other hand, the sensitivity decreases. Under the circumstances, a method has been attempted in such a way that the proportion of p-cresol is increased and the conditions for polymerizing the resin component is varied as appropriate to make an oligomer (a polymer of low molecular weight), thereby ensuring that there will be no drop in the sensitivity of the resulting photoresist. However, this approach has not yet succeeded in attaining sufficient characteristics to be fully compatible with today's microfabrication technology.

Another technique that has been proposed to date comprises producing an alkali-soluble resin by forming a polymer using a mixture of formaldehyde and ketone or an aldehyde of two or more carbon atoms as an agent for polycondensing phenols (see Unexamined Published Japanese Patent Application No. 204146/1993). However, even in this case, no characteristics have yet been attained that are sufficient to be fully compatible with today's microfabrication technology.

The present inventors conducted intensive studies with a view to solving the above-mentioned problems of the prior art. They prepared a polycondensation reaction product (alkali-soluble novolak resin) using a phenolic compound and a mixed aldehyde as a polycondensing agent that was a combination of an unsaturated aliphatic aldehyde and a saturated aliphatic aldehyde in specified amounts and used this resin in a positive photoresist composition. The resulting positive photoresist composition retained high sensitivity and yet had high feature integrity while providing a great depth of focus. The present invention has been accomplished on the basis of this finding.

SUMMARY OF THE INVENTION

An object of the present invention is to provide positive photoresist compositions that have high feature integrity (the percentage of the residual film thickness) in spite of high sensitivity and which yet provide a great depth of focus.

Another object of the present invention is to provide a process for producing such positive photoresist compositions.

A further object of the present invention is to provide alkali-soluble novolak resins that can advantageously be used in such positive photoresist compositions.

Yet another object of the present invention is to provide a method of forming patterns with high reproducibility using the stated positive photoresist compositions.

Thus, according to its first aspect, the present invention relates to a positive photoresist composition which contains (A) an alkali-soluble novolak resin and (B) a quinonediazido group containing compound, characterized in that the alkali-soluble novolak resin (A) is the product of polycondensation of (a) a phenolic compound with (b) a mixed aldehyde consisting essentially of 5–30 mol % of (b-1) an unsaturated aliphatic aldehyde and 70–95 mol % of (b-2) a saturated aliphatic aldehyde.

According to its second aspect, the present invention relates to a process for producing the above-stated positive photoresist compositions using the alkali-soluble novolak resin (A) that is prepared by any one of the following methods of polycondensing the phenolic compound (a) with the mixed aldehyde (b): (I) adding 5–30 mol % of the unsaturated aliphatic aldehyde (b-1) to the phenolic compound (a) to perform reaction, then adding 70–95 mol % of the saturated aliphatic aldehyde (b-2) to perform reaction; (II) adding 70–95 mol % of the saturated aliphatic aldehyde (b-2) to the phenolic compound (a) to perform reaction, then adding 5–30 mol % of the unsaturated aliphatic aldehyde (b-1) to perform reaction; or (III) adding 5–30 mol % of the unsaturated aliphatic aldehyde (b-1) and 70–95 mol % of the saturated aliphatic aldehyde (b-2) simultaneously to the phenolic compound (a) to perform reaction.

According to its third aspect, the present invention relates to alkali-soluble novolak resins for use in photoresist compositions that are the product of condensation of the phenolic compound (a) with the mixed aldehyde (b) which consists essentially of 5–30 mol % of the unsaturated aliphatic aldehyde (b-1) and 70–95 mol % of the saturated aliphatic aldehyde (b-2).

According to its fourth aspect, the present invention relates to a pattern forming method that forms resist patterns by the steps of applying the above-stated positive photoresist composition onto a substrate, drying the coating, performing selective exposure of the coating through a mask pattern, developing the coating, and removing the coating in the exposed area.

DETAILED DESCRIPTION OF THE INVENTION

Described below in detail are the positive photoresist compositions of the present invention, the process for producing the same, as well as the alkali-soluble novolak resins that can advantageously be used in such photoresist compositions.

The alkali-soluble novolak resin contained as component (A) in the positive photoresist composition of the present invention is the product of polycondensation reaction of the phenolic compound (a) with the mixed aldehyde (b) which consists essentially of 5–30 mol % of the unsaturated aliphatic aldehyde (b-1) and 70–95 mol % of the saturated aliphatic aldehyde (b-2).

Examples of the phenolic compound (a) (aromatic hydroxy compound) include but are not limited to:

phenols such as phenol, m-cresol, p-cresol and o-cresol; xylenols such as 2,3-xylenol, 2,5-xylenol, 3,5-xylenol and 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol and 2-tert-butyl-5-methylphenol; alkoxyphenols such as p-methoxyphenol, m-methoxyphenol, p-ethoxyphenol, m-ethoxyphenol, p-propoxyphenol and m-propoxyphenol; isopropenylphenols such as o-isopropenylphenol, p-isopropenylphenol, 2-methyl-4-isopropenylphenol and 2-ethyl-4-isopropenylphenol; arylphenols such as phenylphenol; and polyhydroxyphenols such as 4,4'-dihydroxybiphenyl, bisphenol A, resorcinol, hydroquinone and pyrogallol. These phenolic compounds may be used either alone or in admixture. Among these aromatic hydroxy compounds, combinations of two or more, particularly two or three, phenolic compounds selected from among m-cresol, p-cresol, 2,5-xylenol, and 2,3,5-trimethylphenol are preferred.

When two or more of the four compounds just stated above are to be used in combination, the respective phenolic compounds are preferably incorporated in the following amounts based on the total quantity of the phenolic compounds: 70–95 mol %, particularly 80–90 mol %, of m-cresol; 3–15 mol %, particularly 5–10 mol %, of p-cresol; 3–25 mol %, particularly 5–20 mol %, of 2,5-xylenol; and 3–15 mol %, particularly 5–10 mol %, of 2,3,5-trimethylphenol. According to the present invention, photoresist compositions that satisfy all requirements for high sensitivity, high feature integrity and great depth of focus can be obtained from m-cresol rich phenolic compounds even if they do not contain very large amounts of p-cresol.

The unsaturated aliphatic aldehyde (b-1) is preferably at least one member selected from the group consisting of acrylaldehyde, crotonaldehyde, methacrylaldehyde and 2-methyl-2-butenal. Among these compounds, crotonaldehyde is particularly preferred.

Preferred examples of the saturated aliphatic aldehyde (b-2) include formaldehyde, p-formaldehyde, trioxane, propionaldehyde, butylaldehyde, trimethylaldehyde and so forth. The saturated aliphatic aldehydes may be used either alone or in admixture. Among the compounds listed above, formaldehyde is used with particular preference.

In the present invention, the mixed aldehyde (b) consisting essentially of 5–30 mol %, preferably 7–15 mol %, of the unsaturated aliphatic aldehyde (b-1) and 70–95 mol %, preferably 75–93 mol %, of the saturated aliphatic aldehyde (b-2) is used as a polycondensing agent, which is reacted with the stated phenolic compound (a) to yield the alkali-soluble novolak resin (A) which is the resulting product of polycondensation reaction.

The polycondensation reaction of the phenolic compound (a) with the mixed aldehyde (b) can be performed by known procedures in the presence of acidic catalysts. Examples of acidic catalysts that may be used include hydrochloric acid, sulfuric acid, formic acid, oxalic acid and p-toluenesulfonic acid. When the reaction is to be performed using highly reactive compounds such as the saturated aliphatic aldehyde, weak to moderate acids such as oxalic acid are preferably used; on the other hand, when the reaction is to be performed using less reactive compounds such as the unsaturated aliphatic aldehyde, strong acids such as p-toluenesulfonic acid are preferably used.

The polycondensation of the phenolic compound (a) with the mixed aldehyde (b) may be performed by any one of the following three methods:

(I) adding 5–30 mol %, preferably 7–15 mol %, of the unsaturated aliphatic aldehyde (b-1) to the phenolic compound (a) to perform reaction (primary reaction), then adding 70–95 mol %, preferably 75–93 mol %, of the saturated aliphatic aldehyde (b-2) to perform reaction (secondary reaction);

(II) adding the stated amount of the saturated aliphatic aldehyde (b-2) to the phenolic compound (a) to perform reaction (primary reaction), then adding the stated amount of the unsaturated aliphatic aldehyde (b-1) to perform reaction (secondary reaction); or (III) adding the stated amount of the unsaturated aliphatic aldehyde (b-1) and the stated amount of the saturated aliphatic aldehyde (b-2) simultaneously to the phenolic compound (a) to perform reaction.

The stated method (I) may specifically be performed as follows: the unsaturated aliphatic aldehyde is added to a solution of the phenolic compound, which is then heated under reflux at 80–120° C. for 2–10 hours and thereafter cooled. Subsequently, the saturated aliphatic aldehyde is added to the cooled solution, which is then heated under reflux at 80–120° C. for 2–10 hours and thereafter the resulting product of polycondensation reaction is recovered.

The stated method (II) may specifically be performed as follows: the saturated aliphatic aldehyde is added to a solution of the phenolic compound, which is then heated under reflux at 80–120° C. until the saturated aliphatic aldehyde is no longer reacted. Thereafter, the reaction vessel is rendered an open system and any unreacted portion of the saturated aliphatic aldehyde is completely removed, followed by cooling of the solution. Subsequently, the unsaturated aliphatic aldehyde is added to the cooled solution, which is then heated under reflux at 80–120° C. for 5–15 hours and thereafter the resulting product of polycondensation reaction is recovered.

The stated method (III) may specifically be performed as follows: the unsaturated aliphatic aldehyde and the saturated aliphatic aldehyde are added simultaneously to a solution of the phenolic compound, which is then heated under reflux at 80–120° C. for 5–15 hours and thereafter the resulting product of polycondensation reaction is recovered. It should, however, be noted that in view of its lower reactivity than the saturated aliphatic aldehyde, the unsaturated aliphatic aldehyde should be added in a greater amount in the method (III) than in the methods (I) and (II). This ensures the production of a resin that has comparable proportions of components to those attained in the methods (I) and (II).

Of the three methods described above, method (I) is the most preferred in view of such aspects as the ease of control of the proportions of the components of the resin to be obtained and its molecular weight. This would be due to the difference in reactivity between the unsaturated aliphatic aldehyde and the saturated aliphatic aldehyde. Stated more specifically, it is believed that by performing polycondensation with the less reactive unsaturated aliphatic aldehyde being first added to the phenolic compound, the composition of the product can be maintained constant in a comparatively easy and reproducible way and it is also possible to control the molecular weight of the product in an easy way.

In the stated method (I) of polycondensation, the product obtained at the end of the primary reaction (i.e., the product of the primary reaction) has a weight average molecular weight of about 200–2,000. The product obtained at the end of the secondary reaction (i.e., the product of the secondary reaction) has a weight average molecular weight of about 1,000–20,000. The weight average molecular weight is calculated for polystyrene by gel permeation chromatography (GPC).

In the stated method (II) of polycondensation, the product obtained at the end of the primary reaction (i.e., the product of the primary reaction) has a weight average molecular weight of about 200–5,000. The product obtained at the end of the secondary reaction (i.e., the product of the secondary reaction) has a weight average molecular weight of about 1,000–20,000.

Any known solvents may be used in the process of polycondensation and a particularly preferred solvent is a mixture of γ-butyrolactone and propylene glycol monoalkyl ether. Exemplary propylene glycol monoalkyl ethers include propylene glycol monomethyl ether, propylene glycol monoethyl ether, propylene glycol monopropyl ether and propylene glycol monobutyl ether. Among these, propylene glycol monopropyl ether is preferred. Propylene glycol monoalkyl ethers are used either alone or in admixture.

After the polycondensation of the phenolic compound with the mixed aldehyde, fractionation is usually performed to cut off the lower-molecular weight region so as to precipitate the alkali-soluble novolak resin (A) which is suitable for use in positive photoresist compositions. Fractionation may be performed in the usual manner such as by dissolving the sated product of the secondary reaction (i.e., the final reaction product) in a solvent such as 2-heptanone, methanol, butyl acetate or methyl isobutyl ketone, then precipitating the resin by the addition of n-heptane, water or the like in an amount about 1–20 times as great as the solids content of the resin.

The resin obtained by fractionation has preferably a weight average molecular weight of about 2,000–20,000, with the range of about 5,000–15,000 being particularly preferred.

In the polycondensation reaction described above, the ratio at which the phenolic compound (a) and the mixed aldehyde (b) are used (mixed) is preferably selected from the range of 99.5:0.5 to 90:10 (in moles) for the phenolic compound (a) to the mixed aldehyde (b). It is particularly preferred to use the mixed aldehyde (b) in 0.7–1.0 mole per 100 moles of the phenolic compound (a).

The thus obtained alkali-soluble novolak resin (A) is such that when it is used in a positive photoresist, it permits the unexposed area to dissolve during development at a speed about 10% slower than in the case where other resins are used.

According to the present invention, the use of the alkali-soluble novolak resin (A) which is obtained by using the mixed aldehyde (b) as a polycondensation agent enables the production of a positive photoresist composition that has high feature integrity in spite of high sensitivity and which yet provides a great depth of focus.

The reason would be as follows: when formaldehyde alone is used as a polycondensation agent in the production of a novolak resin, methylene chains are formed; in contrast, when an unsaturated aliphatic aldehyde such as crotonaldehyde that has a more bulky molecular than formaldehyde and which has unsaturated bonds is used as in the present invention, alkyl groups surround the hydroxyl groups in the phenolic compound, whereupon the resulting resin becomes less soluble in alkali and this would contribute to reduce unwanted loss in the width or depth of the resin in the unexposed area upon contact with a developing solution without impairing the high sensitivity of the resin.

The quinonediazido group containing compounds used as component (B) are the photosensitive component of the photoresist compositions of the invention and examples include naphthoquinone-1,2-diazidosulfonate ester compounds, orthobenzoquinonediazidosulfonate esters, orthoanthraquinonediazidosulfonate esters, etc. and any compounds may be selected from among commonly used photosensitive esters without particular limitations. Preferred examples include esters of hydroxy compounds with naphthoquinone-1,2-diazidosulfonyl halides such as naphthoquinone-1,2-diazido-5-sulfonyl chloride, naphthoquinone-1,2-diazido-4-sulfonyl chloride and naphthoquinone-1,2-diazido-6-sulfonyl chloride.

Examples of the ester forming hydroxy compounds include those listed below under (i)–(iii).

(i) Polyhydroxybenzophenones:

Compounds of this class include 2,3,4-trihydroxybenzophenone, 2,4,4'-trihydroxybenzophenone, 2,4,6-trihydroxybenzophenone, 2,3,4,4'-tetrahydroxybenzophenone, 2,2',4,4'-tetrahydoxybenzophenone, 2,3',4,4',6-pentahydroxybenzophenone, 2,2',3,4,4'-pentahydroxybenzophenone, 2,2',3,4,5'-pentahydroxybenzophenone, 2,3',4,5,5'-pentahydroxybenzophenone and 2,3,3',4,4',5'-hexahydroxybenzophenone.

(ii) Hydroxyaryl compounds represented by the following general formula (I):

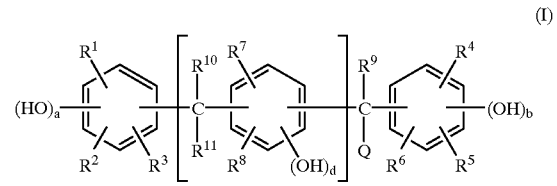

where $R^1$–$R^8$ are each independently a hydrogen atom, a halogen atom, an alkyl group having 1–6 carbon atoms, an alkoxy group having 1–6 carbon atoms or a cycloalkyl group; $R^9$–$R^{11}$ are each independently a hydrogen atom or an alkyl group having 1–6 carbon atoms; Q is a hydrogen atom, an alkyl group having 1–6 carbon atoms or, when taken together with $R^9$, represents a cyclic ring having 3–6 carbon atoms, or a residue represented by the following formula (II):

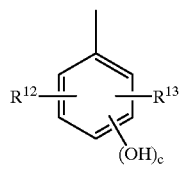

(II)

(where $R^{12}$ and $R^{13}$ are each independently a hydrogen atom, a halogen atom, an alkyl group having 1–6 carbon atoms, an alkoxyl group having 1–6 carbon atoms or a cycloalkyl group; c is an integer of 1–3); a and b are each an integer of 1–3; d is an integer of 0–3; and n is an integer of 0–2.

Compounds of this class include:

hydroxyaryl compounds such as bis[2-hydroxy-3(2-hydroxy-5-methylbenzyl)-5-methylphenyl]methane, tris(4-hydroxyphenyl)-methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis[4-hydroxy-2,5-dimethylphenyl-3-(2-hydroxy-5-methylbenzyl)]methane, bis(4-hydroxy-2,3,5-trimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydoxyphenylmethane, bis(4-hydroxy-2,5-dimethylphenyl)-3,4-dihydroxyphenylmethane, bis(4-hydroxy-3,5-dimethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(5-cyclohexyl-4-hydroxy-2-methylphenyl)-3,4-dihydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis(3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis(3-cyclohexyl-6-hydroxyphenyl)-2-hydroxyphenylmethane, bis(3-cyclohexyl-6-hydroxy-4-methylphenyl)-2-hydroxyphenylmethane, bis(3-cyclohexyl-6-hydroxy-4-methylphenyl)-4-hydroxyphenylmethane, bis(3-cyclohexyl-6-hydroxy-4-methylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane and bis(4-hydroxy-2,3,5-trimethylphenyl)-4-hydroxy-3-methoxyphenylmethane;

bis(hydroxyphenyl)alkane compounds such as 2-(2,3,4-trihydroxyphenyl)-2-(2',3',4'-trihydroxyphenyl)propane, 2-(2,4-dihydroxyphenyl)-2-(2',4'-dihydroxyphenyl)propane, 2-(4-hydroxyphenyl)-2-(4'-hydroxyphenyl)propane, bis(2,3,4-trihydroxyphenyl)methane and bis(2,4-dihydroxyphenyl)methane; and bis(hydroxyphenyl)cycloalkane compounds such as 1,1-bis(4-hydroxyphenyl)cyclohexane and 1,1-bis(2-methyl-4-hydroxyphenyl)cyclohexane.

Other examples include 2,6-bis(4-hydroxy-2,5-dimethylbenzyl)-4-methylphenol, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4,6-dihydroxyphenylmethyl)-4-methylphenol and 2,6-bis(2,3,4-trihydroxyphenylmethyl)-4-methylphenol.

(iii) Phenols:

Compounds of this class include phenol, p-methoxyphenol, dimethylphenol, hydroquinone, bisphenol A, naphthol, pyrocatechol, pyrogallol monomethyl ether, pyrogallol-1,3-dimethyl ether, gallic acid, as well as partially esterified or etherized gallic acid.

Among the hydroxy compounds listed above, the hydroxyaryl compounds represented by the stated general formula (I) are preferably used in order to obtain less-than-half-a-micron patterns which have the salient properties intended by the invention. Particularly preferred are bis[4-hydroxy-2,5-dimethylphenyl-3-(2-hydroxy-5-methylbenzyl)methane, bis(4-hydroxy-2,3,5-trimethylphenyl)-2-hydroxyphenylmethane, bis(5-cyclohexyl-4-hydroxy-2-methylphenyl)-3,4-dihydroxyphenylmethane and 2,6-bis(4-hydroxy-2,5-dimethylbenzyl)-4-methylphenol.

The above-listed esters (i.e., compounds containing a quinonediazido group) which are usable as the photosensitive component can be prepared by subjecting the naphthoquinone-1,2-diazidosulfonyl halides which are already described above and the hydroxy compounds (i)–(iii) to a condensation reaction to effect complete or partial esterification. The condensation reaction is typically performed with advantage in organic solvents such as dioxane, N-methylpyrrolidone and dimethylacetamide in the presence of basic condensing agents such as triethanolamine, alkali carbonates and alkali hydrogencarbonates.

Preferably, the hydroxy compounds are condensed with naphthoquinone-1,2-diazido-4(or 5)-sulfonyl halides in moles corresponding to at least 50%, preferably at least 60%, of the total number of moles of the hydroxyl groups in the hydroxy compound, thereby yielding esters with the average degree of esterification being at least 50%, preferably at least 60%. The use of such esters contributes high resolution.

If desired, the composition of the invention may further contain a sensitizer (sensitivity enhancer) as component (C). A suitable sensitizer is at least one selected from among the hydroxyaryl compounds represented by the general formula (I) set forth above.

Among the hydroxyaryl compounds of the general formula (I), those which are represented by the following general formulae (III) and (IV) are preferable used as a sensitizer:

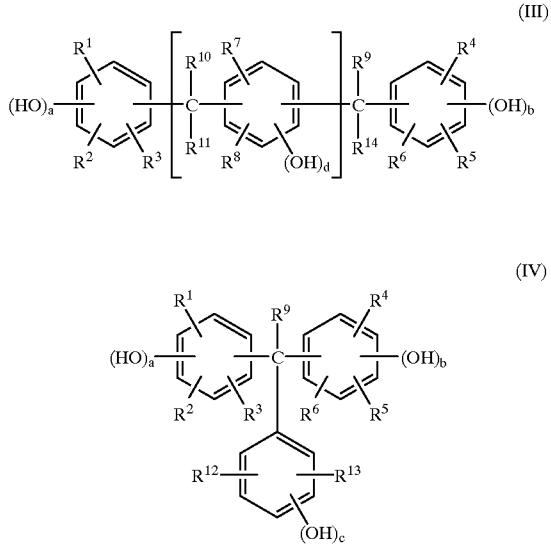

where $R^1$–$R^{13}$, a, b, c, d and n are the same as defined above; $R^{14}$ is a hydrogen atom, an alkyl group having 1–6 carbon atoms or a residue represented by the formula (II) set forth above.

Specifically, among the compounds exemplified hereinabove, the following are preferred: bis(4-hydroxy-2, 3,5-trimethylphenyl)-2-hydroxyphenylmethane, 2,4-bis(3, 5-dimethyl-4-hydroxyphenylmethyl)-6-methylphenol, bis (4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4 -trihydroxyphenylmethyl)-4-methylphenol and 1,1-bis(4-hydroxyphenyl)cyclohexane. Particularly preferred are bis(4-hydroxy-2,3,5-trimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl) ethyl]benzene and 4,6-bis[1-(4-hydroxyphenyl)isopropyl] resorcin.

If these hydroxyaryl compounds are to be incorporated as a sensitivity enhancer, their content is preferably selected from the range of 5–50 wt %, more preferably 10–35 wt %, of the alkali-soluble novolak resin (particularly its solids content) which is component (A) of the composition of the present invention. The use of these hydroxyaryl compounds as the sensitivity enhancer (C) in addition to components (A) and (B) is a more preferred embodiment of the invention since this contributes further improvements not only in the margin of exposure and depth-of-focus characteristics but also in sensitivity.

In the composition of the invention, the proportion of the quinonediazido group containing compound (B) is preferably 5–100 wt %, more preferably 10–50 wt %, of the total content of component (A) (alkali-soluble novolak resin) and the optionally added sensitivity enhancer (hydroxyaryl compound) (C). If the proportion of component (B) is smaller than the prescribed lower limit, images of good pattern fidelity are difficult to produce and the transferability tends to decrease. If the proportion of component (B) is greater than the prescribed upper limit, deteriorated sensitivity and the reduced homogeneity of the resist film to be formed will combine to cause a tendency toward lower resolutions. The compounds listed as component (B) may be used either independently or in combination.

Depending on the need, the composition of the invention may further contain compatible additives to such an extent that they will not be deleterious to the objects of the invention. Specific examples of such additives include: agents for enhancing the margin of exposure and the feature integrity, such as 1,4-bis[1-(3-cyclohexyl-4-hydroxy-6-methylphenyl)isopropyl]benzene; anti-halation UV absorbers such as 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin; and anti-striation surfactants exemplified by fluorine-containing surfactants such as Fluorad FC-430 and FC-431 (trade names of Sumitomo 3M) and F Top EF122A, EF122B, EF122C and EF126 (trade names of Tohkem Products Co.).

The composition of the invention is preferably used in the form of a solution that is prepared by dissolving the following components in suitable solvents: (A) the alkali-soluble novolak resin; (B) the quinonediazido group containing compound as a photosensitive component; and any optional additive components, preferably the hydroxyaryl compound of the stated general formula (I) which serves as sensitivity enhancer (C).

Exemplary solvents include: ketones such as acetone, methyl ethyl ketone, cyclohexanone, methyl isoamyl ketone and 2-heptanone; polyhydric alcohols such as ethylene glycol, propylene glycol, diethylene glycol, ethylene glycol monoacetate, propylene glycol monoacetate and diethylene glycol monoacetate, and derivatives thereof in ether forms such as monomethyl ether, monoethyl ether, monopropyl ether, monobutyl ether and monophenyl ether; cyclic ethers such as dioxane; and esters such as ethyl lactate, methyl acetate, ethyl acetate, butyl acetate, methyl pyruvate, ethyl pyruvate, methyl methoxypropionate and ethyl ethoxypropionate. These solvents may be used either alone or in admixture.

Using the composition of the present invention, one can form patterns with high reproducibility. Stated specifically, a substrate such as a silicon wafer is spun or otherwise coated with a solution having the alkali-soluble novolak resin (A), the quinonediazido group containing compound (B), the sensitizer (C) and any optional additives dissolved in a suitable solvent (see above) and the applied solution is dried to form a photosensitive layer, which is then exposed via a desired mask pattern to any one of a UV light source (e.g. a low-pressure mercury lamp, a high-pressure mercury lamp, an ultra-high pressure mercury lamp, an arc lamp or a xenon lamp) or to a scanning electron beam. The substrate is then immersed in an alkaline aqueous developing solution such as an aqueous solution of 1–10 wt % tetramethylammonium hydroxide (TMAH), whereupon the exposed areas are dissolved away to produce an image having high fidelity to the mask pattern.

EXAMPLES

The following examples are provided for the purpose of further illustrating the present invention but are in no way to be taken as limiting.

Preparation Example 1

A four-necked flask equipped with a stirrer, a heat exchanger and a thermometer was charged with phenols consisting of 162 g (1.5 moles) of m-cresol, 9 g (0.083 moles) of p-cresol and 11.3 g (0.083 moles) of 2,3,5-trimethylphenol, as well as 9.94 g (0.142 moles) of crotonaldehyde and 3 g of p-toluenesulfonic acid. These compounds were dissolved in 273 g of a mixed solvent consisting of γ-butyrolactone and propylpropylene glycol in a weight ratio of 3:7 and primary reaction was performed at a temperature of 100° C. for 3 hours. The resulting polycondensate had a weight average molecular weight of 300. Subsequently, the reaction solution was cooled once and thereafter 103.62 g (1.278 moles) of 37% formaldehyde was added and secondary reaction was performed at a temperature of 100° C. for 5 hours. The resulting polycondensate had a weight average molecular weight of 3,500. The polycondensate (resin) was dissolved in 2-heptanone to give a resin concentration of 15%; subsequently, n-heptane was added in an amount six times as great as the solids content of the resin and fractionation was performed; the precipitating resin was recovered. The recovered resin had a weight average molecular weight of 5,000.

Preparation Examples 2–7 and Comparative Preparation Examples 1–3

Resin samples were prepared by repeating the procedure of Preparation Example 1, except that resins were synthesized using phenols and components of a polycondensation agent (mixed aldehyde) in the molar ratios shown in Table 1 with the volume of the solution being adjusted not to exceed one liter and that the synthesized resins were precipitated by the fractionation steps shown in Table 2.

In Table 1, "MCRE" stands for m-cresol, "PCRE" p-cresol, "235TMP" 2,3,5-trimethylphenol, and "25XY" 2,5-xylenol.

TABLE 1

Alkali-soluble novolak resin

| | Phenolic compound, mol % | | | | Polycondensation agent, mol % | |
|---|---|---|---|---|---|---|
| | MCRE | PCRE | 235TMP | 25XY | Crotonaldehyde | Formaldehyde |
| Prep. Ex. 1 | 90 | 5 | 5 | — | 10 | 90 |
| Prep. Ex. 2 | 85 | 5 | 10 | — | 10 | 90 |
| Prep. Ex. 3 | 90 | 10 | — | — | 10 | 90 |
| Prep. Ex. 4 | 80 | 5 | — | 15 | 10 | 90 |
| Prep. Ex. 5 | 90 | 5 | — | 5 | 10 | 90 |
| Prep. Ex. 6 | 80 | — | — | 20 | 10 | 90 |
| Comp. Prep. Ex. 1 | 60 | 40 | — | — | — | 100 |
| Comp. Prep. Ex. 2 | 60 | 40 | — | — | — | 100 |
| Comp. Prep. Ex. 3 | 40 | 30 | 30 | — | — | 100 |
| Comp. Prep. Ex. 4 | 40 | 20 | — | 40 | — | 100 |
| Comp. Prep. Ex. 5 | 80 | 20 | — | — | 100 | — |
| Comp. Prep. Ex. 6 | 85 | 5 | 10 | — | 10(acetaldehyde) | 90 |
| Comp. Prep. Ex. 7 | 85 | 5 | 10 | — | 50 | 50 |

TABLE 2

| | M.W. after primary reaction | M.W. after secondary reaction | Fractionation step | M.W. after fractionation |
|---|---|---|---|---|
| Prep. Ex. 1 | 300 | 3500 | A1 | 5000 |
| Prep. Ex. 2 | 300 | 3300 | A1 | 4800 |
| Prep. Ex. 3 | 300 | 3430 | A2 | 5000 |
| Prep. Ex. 4 | 300 | 3740 | B1 | 5200 |
| Prep. Ex. 5 | 300 | 5380 | B1 | 7000 |
| Prep. Ex. 6 | 300 | 4510 | B2 | 6000 |
| Comp. Prep. Ex. 1 | | 2800 | A2 | 4200 |
| Comp. Prep. Ex. 2 | | 2800 | B2 | 4200 |
| Comp. Prep. Ex. 3 | | 3400 | A1 | 5000 |
| Comp. Prep. Ex. 4 | | 3000 | B1 | 4500 |
| Comp. Prep. Ex. 5 | | 4500 | A2 | 6000 |
| Comp. Prep. Ex. 6 | 200 | 3000 | A1 | 4500 |
| Comp. Prep. Ex. 7 | 300 | 2500 | A1 | 3800 |

The symbols in the column "Fractionation Step" in Table 2 represent the following treatments.

A1: The resin was dissolved in 2-heptanone to give a resin concentration of 15% and thereafter n-heptane was added in an amount six times as great as the solids content of the resin, whereupon the resin was precipitated.

A2: The resin was dissolved in 2-heptanone to give a resin concentration of 20% and thereafter n-heptane was added in an amount four times as great as the solids content of the resin, whereupon the resin was precipitated.

B1: The resin was dissolved in methanol to give a resin concentration of 13% and thereafter water was added in an amount 2.5 times as great as the solids content of the resin, whereupon the resin was precipitated.

B2: The resin was dissolved in methanol to give a resin concentration of 15% and thereafter water was added in an amount 2.5 times as great as the solids content of the resin, whereupon the resin was precipitated.

Examples 1–6 and Comparative Examples 1–7

The alkali-soluble novolak resins obtained in the respective preparation examples and comparative preparation examples were mixed with the necessary photosensitive component and sensitizer component in the amounts listed in Table 3 and positive photoresist compositions were prepared. The thus prepared positive photoresist compositions were evaluated for their sensitivity, feature integrity and depth of focus by the following methods.

(Sensitivity)

Each of the photoresist compositions was spin coated onto a silicon wafer and dried on a hot plate at 90° C. for 90 seconds to form a resist film 1.05 μm thick. The film was exposed on a reduction projection aligner NSR-2005i10D (NIKON Corp.; NA=0.57) for a length of time that was increased from 0.1 second at 0.01-sec intervals. Thereafter, the wafer was subjected to PEB (post-exposure bake) at 110° C. for 90 seconds, developed in an aqueous solution of 2.38 wt % tetramethylammonium hydroxide (TMAH) at 23° C. for 60 seconds, washed with water for 30 seconds and dried. A minimum exposure time required for the thickness of the resist film in the exposed area to become zero after development was taken as the sensitivity of the photoresist composition under test and measured in milliseconds (ms).

(Feature integrity)

The same procedure described as above was repeated and the thickness of the resist film in the unexposed area after development relative to the thickness before development was evaluated as the percentage of feature integrity.

(Depth of focus)

With Eop (the amount of exposure necessary to produce a line-to spacing ratio of 1:1 for a width of 0.30 μm) being used as a reference, exposure was performed on a reduction projection aligner NSR-2005i10D (NIKON Corp.; NA=0.57) under slightly defocused conditions. After development, the resulting resist patterns were examined by SEM microscopy. A maximum value (μm) of defocusing that allowed a rectangular resist pattern to form in a width of 0.30 μm was designated as the depth of focus.

TABLE 3

|  | Resin | Sensitizer component, wt % | Photosensitive component, wt % | Sensitivity, ms | Depth of focus | Feature integrity, % |
|---|---|---|---|---|---|---|
| Ex. 1 | Prep. Ex. 1 | ADD1:ADD2 7:3 (30) | PAC1:PAC2 6:4 (35) | 185 | 0.7 | 95 |
| Ex. 2 | Prep. Ex. 2 | ADD1:ADD2 7:3 (30) | PAC1:PAC2 6:4 (35) | 255 | 1.0 | 98 |
| Ex. 3 | Prep. Ex. 3 | ADD1:ADD3 8:2 (25) | PAC3:PAC4 9:1 (38) | 240 | 0.8 | 98 |
| Ex. 4 | Prep. Ex. 4 | ADD1:ADD2 7:3 (20) | PAC3:PAC5 5:5 (30) | 260 | 0.6 | 98 |
| Ex. 5 | Prep. Ex. 5 | ADD1:ADD2 7:3 (20) | PAC3:PAC5 5:5 (30) | 240 | 0.6 | 98 |
| Ex. 6 | Prep. Ex. 6 | ADD4 (22) | PAC1:PAC6:PAC7 8:1:1 (32) | 210 | 0.6 | 98 |
| Comp. Ex. 1 | Comp. Prep. Ex. 1 | ADD1:ADD3 8:2 (25) | PAC3:PAC4 9:1 (38) | 350 | 0.3 | 99 |
| Comp. Ex. 2 | Comp. Prep. Ex. 2 | ADD4 (22) | PAC1:PAC6:PAC7 8:1:1 (32) | 205 | 0.2 | 90 |
| Comp. Ex. 3 | Comp. Prep. Ex. 3 | ADD1:ADD2 7:3 (30) | PAC1:PAC2 6:4 (35) | 240 | 0.2 | 90 |
| Comp. Ex. 4 | Comp. Prep. Ex. 4 | ADD1:ADD2 7:3 (20) | PAC3:PAC5 5:5 (30) | 220 | 0 | 90 |
| Comp. Ex. 5 | Comp. Prep. Ex. 5 | ADD1:ADD3 8:2 (25) | PAC3:PAC4 9:1 (38) | 500 | 0 | 100 |
| Comp. Ex. 6 | Comp. Prep. Ex. 6 | ADD1:ADD2 7:3 (30) | PAC1:PAC2 6:4 (35) | 240 | 0.7 | 95 |
| Comp. Ex. 7 | Comp. Prep. Ex. 7 | ADD1:ADD2 7:3 (30) | PAC1:PAC2 6:4 (35) | 480 | 0 | 90 |

In Table 3, the parenthesized figures (wt %) for the amounts of the sensitizer component indicate values relative to the solids content of the resin taken as 100, and the parenthesized figures (wt %) for the amounts of the photosensitive component indicate values relative to the sum of the solids content of the resin and the sensitizer component which is taken as 100.

The symbols in Table 3 represent the following compounds.

ADD1: 1-[1-(4-hydroxyphenyl)isopropyl]-4-[1,1-bis(4-hydroxyphenyl)ethyl]benzene;

ADD2: bis(4-hydroxy-2,3,5-trimethylphenyl)-2-hydroxyphenylmethane;

ADD3: bis(4-hydroxy-3,5-dimethylphenyl)-3,4-dihydroxyphenylmethane;

ADD4: 4,6-bis[1-(4-hydroxyphenyl)isopropyl]resorcin;

PAC1: ester of 1.0 mole of bis(5-cyclohexyl-4-hydroxy-2-methylphenyl)-3,4-dihydroxyphenylmethane with 2.0 moles of naphthoquinone-1,2-diazido-5-sulfonyl chloride;

PAC2: ester of 1.0 mole of bis[4-hydroxy-2,5-dimethylphenyl)-3-(2-hydroxy-5-methylbenzyl)]methane with 2.0 moles of naphthoquinone-1,2-diazido-5-sulfonyl chloride;

PAC3: ester of 1.0 mole of 2,6-bis(4-hydroxy-2,5-dimethylbenzyl)-4-methylphenol with 2.0 moles of naphthoquinone-1,2-diazido-5-sulfonyl chloride;

PAC4: ester of 1.0 mole of 1-[1-(4-hydroxyphenyl)-isopropyl]-4-[1,1-bis(4-hydroxyphenyl)ethyl]benzene with 3.0 moles of naphthoquinone-1,2-diazido-5-sulfonyl chloride;

PAC5: ester of 1.0 mole of bis(4-hydroxy-2,3,5-trimethylphenyl)-2-hydroxyphenylmethane with 2.0 moles of naphthoquinone-1,2-diazido-5-sulfonyl chloride;

PAC6: ester of 1.0 mole of 1-[1-(4-hydroxyphenyl)-isopropyl]-4-[1,1-bis(4-hydroxyphenyl)ethyl]benzene with 2.0 moles of naphthoquinone-1,2-diazido-5-sulfonyl chloride;

PAC7: ester of 1.0 mole of bis(4-hydroxy-3,5-dimethylphenyl)-3,4-dihydroxyphenylmethane with 2.0 moles of naphthoquinone-1,2-diazido-5-sulfonyl chloride.

As described above in detail, the use of the alkali-soluble novolak resins of the present invention enables the production of positive photoresist compositions that have high sensitivity and which yet provide high feature integrity and great depth of focus. Using such positive photoresist compositions, one can form resist patterns that are improved in reproducibility and other properties.

What is claimed is:

1. A positive photoresist composition which contains (A) an alkali-soluble novolak resin and (B) a quinonediazido group containing compound, wherein the alkali-soluble novolak resin (A) is the product of polycondensation of (a) a phenolic compound with (b) a mixed aldehyde consisting essentially of 5–30 mol % of (b-1) an unsaturated aliphatic aldehyde and 70–95 mol % of (b-2) a saturated aliphatic aldehyde.

2. The positive photoresist composition according to claim 1, wherein the unsaturated aliphatic aldehyde (b-1) is at least one member selected from the group consisting of acrylaldehyde, crotonaldehyde, methacrylaldehyde and 2-methyl-2-butenal.

3. The positive photoresist composition according to claim 2, wherein the unsaturated aliphatic aldehyde (b-1) is crotonaldehyde.

4. The positive photoresist composition according to claim 1, wherein the saturated aliphatic aldehyde (b-2) is formaldehyde.

5. The positive photoresist composition according to claim 1, wherein the mixed aldehyde (b) consist of 7–15 mol % of crotonaldehyde and 85–93 mol % of formaldehyde.

6. The positive photoresist composition according to claim 1, wherein the phenolic compound (a) contains at least two members selected from among m-cresol, p-cresol, 2,5-xylenol and 2,3,5-trimethylphenol.

7. The positive photoresist composition according to claim 6, wherein the phenolic compound (a) contains two or three members selected from among m-cresol in 70–95 mol %, p-cresol in 3–15 mol %, 2,5-xylenol in 3–25 mol % and 2,3,5-trimethylphenol in 3–15 mol %.

8. The positive photoresist composition according to claim 1, wherein the phenolic compound (a) is polycondensed with the mixed aldehyde (b) using the phenolic compound (a) and the mixed aldehyde (b) in a molar ratio of 90:10 to 99.5:0.5.

9. The positive photoresist composition according to claim 1, wherein the quinonediazido group containing compound (B) is the product of esterificatoin of a hydroxylaryl compound with a naphthoquinone-1,2-diazidosulfonyl acid compound, said hydroxylaryl compound being represented by the following general formula (I):

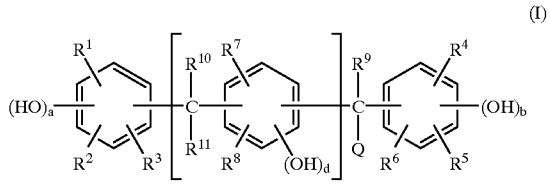

(I)

where $R^1$–$R^8$ are each independently a hydrogen atom, a halogen atom, an alkyl group having 1–6 carbon atoms, an alkoxy group having 1–6 carbon atoms or a cycloalkyl group; $R^9$–$R^{11}$ are each independently a hydrogen atom or an alkyl group having 1–6 carbon atoms; Q is a hydrogen atom, an alkyl group having 1–6 carbon atoms or, when taken together with $R^9$, represents a cyclic ring having 3–6 carbon atoms, or a residue represented by the following formula (II):

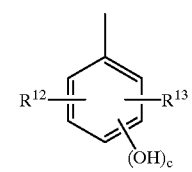

(II)

(where $R^{12}$ and $R^{13}$ are each independently a hydrogen atom, a halogen atom, an alkyl group having 1–6 carbon atoms, an alkoxyl group having 1–6 carbon atoms or a cycloalkyl group; c is an integer of 1–3); a and b are each an integer of 1–3; d is an integer of 0–3; and n is an integer of 0–2.

10. The positive photoresist composition according to claim 1, which further contains a hydroxyaryl compound of the following general formula (I) as (C) sensitivity enhancer:

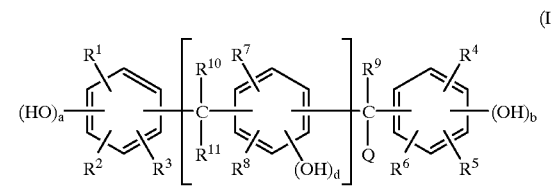

(I)

where $R^1$–$R^8$ are each independently a hydrogen atom, a halogen atom, an alkyl group having 1–6 carbon atoms, an alkoxyl group having 1–6 carbon atoms or a cycloalkyl group; $R^9$–$R^{11}$ are each independently a hydrogen atom or an alkyl group having 1–6 carbon atoms; Q is a hydrogen atom, an alkyl group having 1–6 carbon atoms or, when taken together with $R^9$, represents a cyclic ring having 3–6 carbon atoms, or a residue represented by the following formula (II):

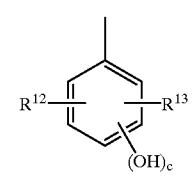

(II)

(where $R^{12}$ and $R^{13}$ are each independently a hydrogen atom, a halogen atom, an alkyl group having 1–6 carbon atoms, an alkoxyl group having 1–6 carbon atoms or a cycloalkyl group; c is an integer of 1–3); a and b are each an integer of 1–3; d is an integer of 0–3; and n is an integer of 0–2.

11. A process for producing the positive photoresist composition of claim 1 which comprises: dissolving the following components in suitable solvents: (A) said alkali-soluble novolak resin; (B) a quinone diazido group containing compound as a photosensitive component and using as the alkali-soluble novolak resin (A) one that is prepared as the product of polycondensation reaction by any one of the following methods of polycondensing the phenolic compound (a) with the mixed aldehyde (b): (I) adding 5–30 mol % of the unsaturated aliphatic aldehyde (b-1) to the phenolic compound (a) to perform reaction, then adding 70–95 mol % of the saturated aliphatic aldehyde (b-2) to perform reaction; (II) adding 70–95 mol % of the saturated aliphatic aldehyde (b-2) to the phenolic compound (a) to perform reaction, then adding 5–30 mol % of the unsaturated aliphatic aldehyde (b-1) to perform reaction; or (III) adding 5–30 mol % of the unsaturated aliphatic aldehyde (b-1) and 70–95 mol % of the saturated aliphatic aldehyde (b-2) simultaneously to the phenolic compound (a) to perform reaction.

12. The process according to claim 11, wherein the polycondensation of the phenolic compound (a) with the mixed aldehyde (b) is performed by first adding 5–30 mol % of the unsaturated aliphatic aldehyde (b-1) to the phenolic compound (a) to perform reaction, then adding 70–95 mol % of the saturated aliphatic aldehyde (b-2) to perform reaction.

13. The process according to claim 11, wherein the phenolic compound (a) is polycondensed with the mixed aldehyde (b) using the phenolic compound (a) and the mixed aldehyde (b) in a molar ratio of 90:10 to 99.5:0.5.

14. An alkali-soluble novolak resin for using in photoresist compositions that is the product of polycondensation of a phenolic compound (a) with a mixed aldehyde (b) consisting essentially of 5–30 mol % of an unsaturated aliphatic aldehyde (b-1) and 70–95 mol % of a saturated aliphatic aldehyde (b-2).

15. The alkali-soluble novolak resin according to claim 14, wherein the polycondensation of the phenolic compound (a) with the mixed aldehyde (b) is performed by any one of the following methods: (I) adding 5–30 mol % of the unsaturated aliphatic aldehyde (b-1) to the phenolic compound (a) to perform reaction, then adding 70–95 mol % of the saturated aliphatic aldehyde (b-2) to perform reaction; (II) adding 70–95 mol % of the saturated aliphatic aldehyde (b-2) to the phenolic compound (a) to perform reaction, then adding 5–30 mol % of the unsaturated aliphatic aldehyde (b-1) to perform reaction; or (III) adding 5–30 mol % of the unsaturated aliphatic aldehyde (b-1) and 70–95 mol % of the saturated aliphatic aldehyde (b-2) simultaneously to the phenolic compound (a) to perform reaction.

16. The alkali-soluble novolak resin according to claim 15, wherein the polycondensation of the phenolic compound (a) with the mixed aldehyde (b) is performed by first adding 5–30 mol % of the unsaturated aliphatic aldehyde (b-1) to the phenolic compound (a) to perform reaction, then adding 70–95 mol % of the saturated aliphatic aldehyde (b-2) to perform reaction.

17. The alkali-soluble novolak resin according to claim 14, wherein the phenolic compound (a) contains at least two members selected from among m-cresol, p-cresol, 2,5-xylenol and 2,3,5-trimetylphenol.

18. The alkali-soluble novolak resin according to claim 17, wherein the phenolic compound (a) contains two or three members selected from among m-cresol in 70–95 mol %, p-cresol in 3–15 mol %, 2,5-xylenol in 3–25 mol % and 2,3,5-trimethylphenol in 3–15 mol %.

19. A pattern forming method that forms resist patterns by the steps of applying the positive photoresist composition of claim 1 onto a substrate, drying the coating, performing selective exposure of the coating through a mask pattern, developing the coating, and removing the coating in the exposed area.

* * * * *

UNITED STATES PATENT AND TRADEMARK OFFICE
CERTIFICATE OF CORRECTION

PATENT NO.      : 6,083,657
APPLICATION NO. : 09/231826
DATED           : July 4, 2000
INVENTOR(S)     : Shinichi Kono et al.

Page 1 of 1

It is certified that error appears in the above-identified patent and that said Letters Patent is hereby corrected as shown below:

Column 9, lines 1-10, formula (III) should read:

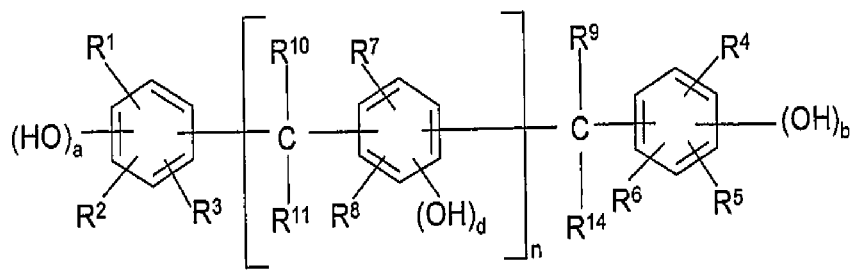

Signed and Sealed this

Sixteenth Day of January, 2007

JON W. DUDAS
*Director of the United States Patent and Trademark Office*

UNITED STATES PATENT AND TRADEMARK OFFICE
CERTIFICATE OF CORRECTION

PATENT NO.       : 6,083,657
APPLICATION NO.  : 09/231826
DATED            : July 4, 2000
INVENTOR(S)      : Shinichi Kono et al.

It is certified that error appears in the above-identified patent and that said Letters Patent is hereby corrected as shown below:

Column 6, lines 52-60; and (column 15, lines 53-62) ; and Claim 10 (column 16, lines 24-32) ; formula (I) should read:

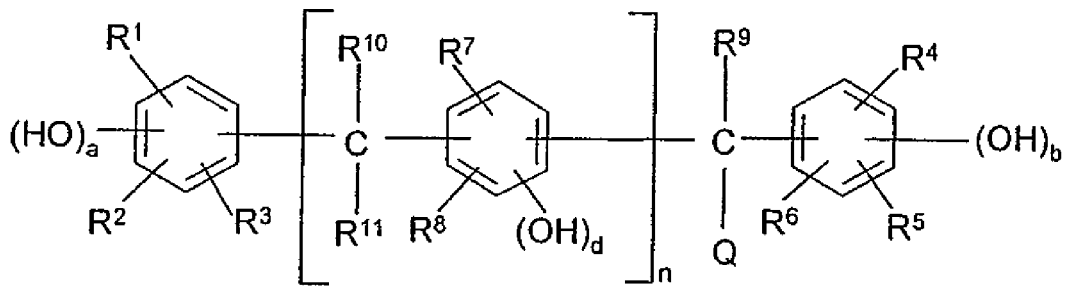

Signed and Sealed this

Fifteenth Day of May, 2007

JON W. DUDAS
*Director of the United States Patent and Trademark Office*